June 23, 1964 O. DALTON ETAL 3,138,764
RAMP GENERATOR EMPLOYING COMPARATOR CIRCUIT FOR MAINTAINING CONSTANT STARTING VOLTAGES FOR DIFFERENT TIMING RESISTORS
Filed July 9, 1962
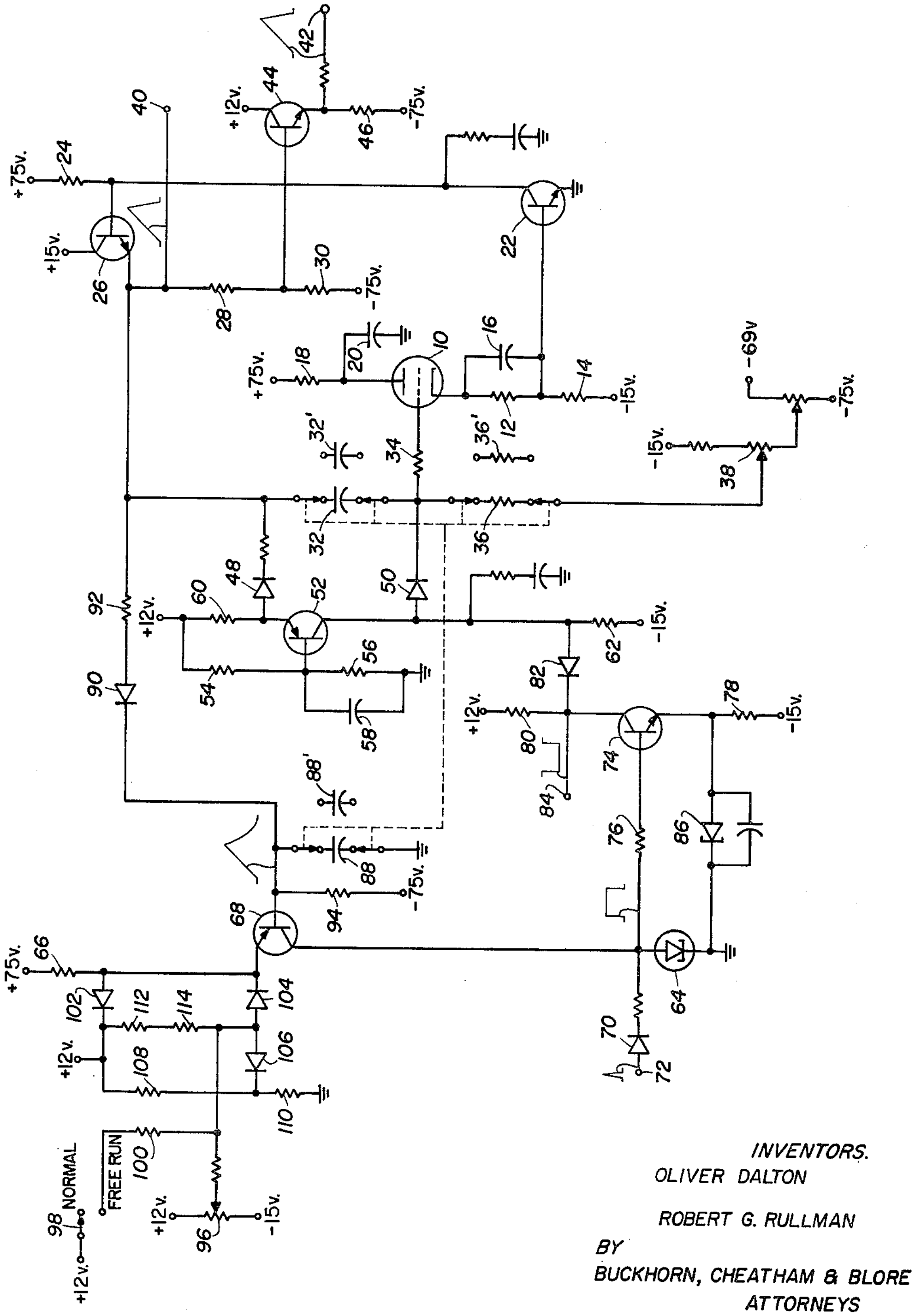
INVENTORS.
OLIVER DALTON
ROBERT G. RULLMAN
BY
BUCKHORN, CHEATHAM & BLORE
ATTORNEYS United States Patent Office 3,138,764
Patented June 23, 1964

3,138,764
RAMP GENERATOR EMPLOYING COMPARATOR CIRCUIT FOR MAINTAINING CONSTANT STARTING VOLTAGES FOR DIFFERENT TIMING RESISTORS

Oliver Dalton and Robert G. Rullman, Beaverton, Oreg., assignors to Tektronix, Inc., Beaverton, Oreg., a corporation of Oregon Filed July 9, 1962, Ser. No. 208,505
8 Claims. (Cl. 328—182)

The subject matter of the present invention relates generally to electrical signal generator circuits and in particular to ramp voltage generator circuits which produce a ramp voltage which increases in magnitude from a quiescent value to a peak value at a substantially constant rate with respect to time and then returns to quiescent voltage before another ramp voltage is produced.

The ramp voltage generator circuit of the present invention is especially useful as the horizontal sweep generator in a cathode ray oscilloscope to produce a time base sweep voltage which varies linearly with time during the ramp portion thereof.

The ramp voltage generator circuit of the present invention is an improvement over prior ramp voltage generator circuits in that the starting voltage of the linear ramp or sweep portion of the ramp voltage is maintained more nearly constant than is the case with even the best of the prior generators when the values of the timing resistors and timing capacitors employed in such generator circuits are changed to provide different sweep speeds. Also the linearity of the ramp voltage is improved over such prior ramp signal generators. In addition the present ramp generator circuit includes an improved and simplified hold-off circuit for preventing premature triggering of the ramp generator circuit.

Briefly, one embodiment of the ramp voltage generator circuit of the present invention includes a hybrid Miller integrator circuit employing a transistor connected as a common emitter amplifier and a vacuum tube connected as an input cathode follower amplifier for supplying signal current to the base of such transistor. The amplifier transistor has its output connected back to the input of the cathode follower tube through an A.C. feedback circuit including a timing capacitor. A timing resistor is connected in series with the timing capacitor between the capacitor and a source of charging current for such capacitor. A gating circuit is connected to the Miller integrator circuit and includes a pair of disconnect diodes which are normally forwardly biased so as to be conducting to prevent charging of the timing capacitor when the ramp voltage generator is in its quiescent state, and which are reversely biased so as to be nonconducting to allow charging of such timing capacitor at a linear rate when the ramp portion of the generator voltage is being produced. A clamping or comparator transistor is connected in a series circuit with the disconnect diodes to provide a D.C. feedback circuit from the output of the Miller amplifier transistor to the input of the cathode follower tube when the disconnect diodes are conducting and the ramp voltage generator is in its quiescent state. Under these conditions the comparator transistor compares the output voltage of the ramp generator with a reference voltage and supplies an amplified correction voltage to the input of the Miller integrator circuit to maintain such output voltage constant so that the starting voltage of the ramp voltage does not vary with different timing resistors. The ramp voltage generator also includes a tunnel diode bistable multivibrator as part of its gating circuit to control the conduction of the disconnect diodes by the proper triggering of such multivibrator. A multivibrator reverting and hold-off circuit is connected from the output of such Miller integrator circuit to the input of such multivibrator. Such circuit, after it has caused reversion of the multivibrator and stopped the generation of the sweep portion of the ramp voltage, insures proper triggering of such multivibrator by means of a hold-off resistor and capacitor. The hold-off capacitor is connected to the base of a control transistor whose collector is connected to the tunnel diode and whose emitter is connected to two or more sources of biasing current for such tunnel diode through a voltage limiting circuit which sets the upper and lower voltage limits of such emitter, so that the voltage produced on such capacitor reverts the multivibrator when it exceeds this upper voltage limit and prevents triggering of such multivibrator until it goes below this lower voltage limit by controlling the flow of such biasing current through such transistor.

It is therefore one object of the present invention to provide an improved ramp signal generator circuit.

Another object of the invention is to provide an improved ramp signal generator circuit of the type employing a Miller integrator circuit to generate a ramp-shaped voltage signal which increases in magnitude substantially linearly and which starts at substantially the same quiescent voltage regardless of the value of the timing capacitor and the timing resistor employed in such Miller integrator circuit to generate such ramp signal.

A further object of the present invention is to provide an improved time base sweep generator circuit employing a hybrid Miller integrator which produces a ramp voltage of greater linearity.

An additional object of the present invention is to provide a time base sweep generator circuit for use in a cathode ray oscilloscope in which an improved hold-off circuit is employed to prevent triggering of a sweep operation of such circuit until after the circuit has recovered from a previous sweep operation.

A further object of the invention is to provide an improved control circuit for a tunnel diode bistable multivibrator employed for supplying a gating voltage in a ramp voltage generator circuit.

Other objects and advantages of the present invention will be apparent from the following detailed description of a preferred embodiment thereof shown in the attached drawings of which:

The single figure is a schematic diagram of one embodiment of the time base sweep generator circuit of the present invention.

The ramp signal generator circuit shown in FIGURE 1 includes a hybrid Miller integrator circuit having a triode vacuum tube 10, such as a Nuvistor, connected as a cathode follower at the input of such Miller integrator. The cathode of such cathode follower tube is connected to a source of negative D.C. bias voltage through a pair of load resistors 12 and 14 connected in series as a voltage divider with the resistor 12 shunted by a bypass capacitor 16. The anode of tube 10 is connected to a source of positive D.C. bias voltage through a parasitic oscillation suppressor resistor 18 which is bypassed to ground by a decoupling capacitor 20. An NPN-type Miller amplifier transistor 22, connected as a common emitter amplifier, has its base connected to the output of cathode follower tube 10 across load resistor 14 and its collector connected to a source of positive D.C. bias voltage through a load resistor 24 so that such transistor functions as the high gain voltage amplifier stage of the Miller integrator circuit. An NPN-type feedback transistor 26, connected as an emitter-follower, has its collector connected to a source of positive D.C. bias voltage and its base connected to the output of Miller amplifier transistor 22. The emitter of feedback transistor 26 is connected to a source of negative D.C. bias voltage through a pair of series connected voltage divider load resistors 28 and 30. A timing capacitor 32 has one terminal connected to the emitter of the feedback transistor 26 and its other terminal connected to the grid of cathode follower tube 10 through a parasitic oscillation suppressor resistor 34 in order to provide a degenerative A.C. voltage feedback loop, including the feedback transistor 26 and such timing capacitor, from the output to the input of the Miller integrator circuit.

A timing resistor 36 is connected from the common terminal of the coupling resistor 34 and the timing capacitor 32 to a regulated source of substantially constant voltage whose value is controlled by the setting of the movable contact of a variable resistance potentiometer 38 having its end interminals connected to sources of different negative D.C. bias voltages. Current flowing from this voltage source through the timing resistor 36 charges timing capacitor 32, when a gating signal is applied in a manner hereafter described, to produce a ramp-shaped voltage signal across load resistors 28 and 30 having a substantially linear ramp portion which increases in voltage at a substantially constant rate due to the operation of the Miller integrator circuit. As a result of such operation the voltage at the grid of cathode follower tube 10 remains substantially constant regardless of the voltage across the timing capacitor because of negative A.C. voltage feedback. This means that the voltage across timing resistor 100 remains constant so the charging current for timing capacitor 32 also remains constant. The ramp voltage is terminated and reduced to its initial or quiescent voltage as described below and the resulting sawtooth output signal appears at output terminal 40 across both load resistors 28 and 30 and also appears as the sweep output signal at output terminal 42 after being transmitted through an NPN-type emitter-follower transistor 44. The base of transistor 44 is connected to the common terminal of load resistors 28 and 30 and its collector is connected to a source of positive A.C. bias voltage, while its emitter is connected to a source of negative D.C. bias voltage through a load resistor 46 and is also connected to the output terminal 42.

The operation of the Miller integrator circuit is controlled by a gating circuit including a pair of disconnect diodes 48 and 50 which have their cathodes connected to the upper and lower terminals respectively of the timing capacitor 32. A PNP-type clamping or comparator transistor 52, connected as a common base amplifier has its emitter connected to the anode of the disconnect diode 48 and its collector connected to the anode of disconnect diode 50. The base of the clamping transistor is connected to a source of positive D.C. bias voltage through a biasing circuit including a pair of voltage divider resistors 54 and 56 connected in series between such voltage source and ground with bias resistor 56 shunted by a bypass capacitor 58. The D.C. reference voltage developed across bias resistor 56 is applied to such base electrode and sets the start of the output sweep signal in a manner hereafter discussed. The emitter of clamping transistor 52 is also connected to such voltage source through an emitter bias resistor 60 and the collector of such transistor is connected to a source of negative D.C. bias voltage through a collector load resistor 52. The emitter-collector circuit of the clamping transistor is normally conducting to provide a D.C. current path beween the anodes of normally forward biased disconnect diodes 48 and 50. A sweep gating multivibrator, in the form of a tunnel diode 64 connected as a bistable multivibrator controls the conduction of disconnect diodes 48 and 50 and therefore the time of generation of the output sweep signal. The cathode of this tunnel diode is connected to ground and its anode is connected to a source of positive D.C. bias voltage through a load resistor 66 and the emitter-collector circuit of a PNP-type control transistor 68, which functions as part of a stability control circuit and also as part of a hold-off circuit hereafter described.

Postive input trigger pulses are transmitted to the anode of tunnel diode 64 through a coupling diode 70 from an input terminal 72. The tunnel diode is biased in its low voltage state when the sweep generator is at its quiescent state. A trigger pulse triggers such tunnel diode from its low voltage stable state to a high voltage stable state. Such input trigger pulse may be produced by a trigger pulse generator (not shown) in response to the receipt of a vertical input signal by the cathode ray oscilloscope.

The anode of the tunnel diode 64 is connected to the base of a switching transistor 74 through a coupling resistor 76 to transmit the output pulse of such tunnel diode to the input of such switching transistor. The switching transistor is connected as a common emitter amplifier with its emitter connected to a source of negative D.C. bias voltage through a bias resistor 78 and with its collector connected to a source of positive D.C. bias voltage through a load resistor 80. The negative going output signal from the switching transistor 74 is transmitted to the anodes of the disconnect diodes 48 and 50 through a coupling diode 82 having its cathode connected to the emitter of such transistor and its anode connected to the collector of clamping transistor 52. This negative output signal from transistor 74 reverses the bias on such disconnect diodes to render them nonconducting. The timing capacitor 32 then charges at a linear rate through the timing resistor 36 and potentiometer 38. The negative voltage on the collector of switching transistor 74 may also be transmitted to an unblanking circuit or to a "plus gate" signal generating circuit (not shown) connected at output terminal 84. It should be noted that a backward diode 86, may have its cathode connected to the cathode of tunnel diode 64 and its anode connected to the emitter of switching transistor 74 in order to control the amount of saturation current drawn by such switching transistor when it is rendered conducting by the positive going output pulse from such tunnel diode. This backward diode also aids in driving such switching transistor back to its normal nonconducting state by transmitting a positive going pulse from the cathode of the tunnel diode 64 when it is reverted to its original low voltage state.

A feedback circuit including a hold-off capacitor 88 extends from the collector of Miller amplifier transistor 22 through the emitter-follower transistor 26 and the amplifier transistor 68 to the anode of the tunnel diode 64. The positive going leading edge or ramp portion of the output voltage developed across the load resistors 28 and 30 is transmitted to the hold-off capacitor 88 through a coupling diode 90, having its cathode connected to the upper terminal of such capacitor and its anode connected to such load resistors through a coupling resistor 92, in order to charge such hold-off capacitor by positive voltage corresponding to such ramp portion. This positive voltage is applied to the base of the transistor 68 to reduce the base forward bias voltage and also the emitter-to-collector current of such transistor at a predetermined ramp voltage, the emitter current of such transistor drops to a low value as described below to cause the tunnel diode to revert to its original quiescent state and the ramp voltage to fall rapidly to its quiescent value.

When the resulting trailing edge of the output voltage across load resistors 28 and 30 thus goes in the negative direction and returns to its normal quiescent value during the retrace portion of the sweep voltage, his trailing edge portion of the ramp output signal is not transmitted to the hold-off capacitor 88 because the positive voltage charge on such capacitor reverse biases the coupling diode 90. Thus instead of discharging through its charging resistance including resistor 94, the hold-off capacitor discharges to ground through a hold-off resistor 94 connected between the upper terminal of the hold-off capacitor 88 and a source of negative D.C. bias voltage which functions to bias the control transistor 68. As a result the trailing edge of the hold-off signal applied to the base of control transistor 68 is "stretched" in that it requires a longer fall time to return to its normal quiescent value than the ramp output signal from the sweep generator. The positive going voltage on the collector of transistor 68 as a result of the trailing edge of the holdoff signal referred to above, is thus delayed in its return to quiescence and the return of the multivibrator tunnel diode 64 toward triggering condition is likewise delayed. Trigger pulses from terminal 72 thus cannot cause the sweep generator to again start until it has had time to fully recover from a previous operation.

The total current supplied to the emitter of amplifier transistor 68 is in part controlled by the adjustment of a stability potentiometer 96. Such potentiometer has one of its end terminals connected to a positive voltage source and its other end terminal connected to a negative voltage source. The movable contact is connected to the emitter of the transistor 68 through a later described circuit to control the current supplied to the tunnel diode 64. This bias current is normally set just below the peak current of such tunnel diode when a selector switch 98 is in the "Normal" position shown. This switch position allows triggered operation of the tunnel diode bistable multivibrator 64 by trigger pulses from terminal 72. However, the movable contact of selector switch 98 is connected to a source of positive D.C. bias voltage so that when it is switched into "Free Run" position additional bias current is supplied to the emitter of transistor 68 through a bias resistor 100. This additional bias current causes the tunnel diode to be again switched to start another operation of the ramp voltage generator by the return of the hold-off voltage to its initial or quiescent value. The result is that the entire sweep circuit operates as a free running oscillator to produce repeated ramp output voltages without requiring an input trigger pulse.

A voltage-limiting circuit including an upper limit diode 102 and a lower limit diode 104 is connected to the emitter of control transistor 68 to maintain the voltage of such emitter between an upper limit of, for example, about +12 volts set by the voltage on the cathode of diode 102 and a lower limit of, for example, of about +4 volts set by the voltage on the anode of diode 104. Limiting diode 102 is normally nonconducting, however, when the voltage on the emitter of transistor 68 tends to exceed +12 volts by attempting to follow the ramp portion of the hold-off signal such diode becomes conducting and limits such emitter voltage to a maximum of about +12 volts. This maximum voltage limiting action allows the control transistor 68 to be rendered suddenly nonconducting or of substantially reduced conduction when the positive voltage applied to the base thereof exceeds about +12 volts since its emitter junction is then reverse biased. As discussed above this causes reversion of the tunnel diode 64 to its initial quiescent state. The anode of limiting diode 104 is connected to the anode of a biasing diode 106 which is normally conducting and forms part of a biasing circuit for such limiting diode. A pair of voltage divider resistors 108 and 110 are connected in series between the +12 volt source of bias voltage and ground while another pair of resistors 112 and 114 are connected in series between such voltage source and the anodes of the diodes 104 and 106. The cathode of the diode 106 is connected to the common terminal of the voltage divider resistors 108 and 110. The biasing circuit including voltage divider resistors 108, 110, bias resistors 112, 114 and biasing diode 106 establishes a lower limit voltage of about +4 volts on the anode of limiting diode 104. Therefore, when the negative going trailing edge of the positive hold-off signal returns to its normal bias voltage to carry the base of transistor 68 to this voltage, the voltage on the emitter of such transistor follows such return until it reaches approximately +4 volts since limiting diode 104 is reverse biased during this time. When the voltage on the emitter reaches about 4 volts, it is prevented from going further negative by the limiting diode 104 becoming conducting so that further decreases in the hold-off voltage cause the emitter junction of transistor 68 to suddenly become highly forward biased. This allows additional bias current to flow from the sources connected to resistors 96 or 100 depending upon the position of switch 98, through diode 104 to the tunnel diode 64. The current from resistor 100 is always sufficient to switch the tunnel diode 64 to its high voltage stable state and cause it to free run. The current from the resistor 96 can be controlled so as to be insufficient to cause free-running but sufficient to enable triggering of the tunnel diode by trigger pulses from the terminal 72. Thus, the setting of the movable contact on potentiometer resistor 96 controls the amount of bias current flowing through tunnel diode 64 when the circuit is in its quiescent state. It is therefore the setting of this potentiometer which controls the stability or trigger sensitivity of such tunnel diode multivibrator and the amplitude of the input trigger pulse required to trigger such multivibrator. Such stability control will usually have sufficient range to also cause the entire sweep or ramp generator circuit to free run.

The operation of the sweep generator circuit of the present invention is similar in many respects to the operation of known types of sweep generator circuits, such as that shown in FIG. 6 of U.S. Patent No. 2,853,609, so that its operation will be described only briefly. Positive input trigger pulses are applied to the input terminal 72 and transmitted to the anode of tunnel diode 64 to switch such tunnel diode from its normal low voltage stable state to its high voltage stable state. This produces a positive going step voltage which is applied to the base of normally nonconducting switching transistor 74 to render such transistor conducting so that a negative going step voltage is produced on the collector of such switching transistor. This negative voltage is transmitted through the coupling diode 82 to the anodes of the normally conducting disconnect diodes 48 and 50 to render such disconnect diodes nonconducting. The two terminals of the timing capacitor 32 are normally connected to each other and to ground by the normally conducting disconnect diodes 48 and 50 and the transistor 52. However, when disconnect diodes 48 and 50 are rendered nonconducting, the timing capacitor 32 starts to charge through the timing resistor 36. The voltage on the lower terminal of the timing capacitor tends to become more negative and tends to decrease the voltage drop across the timing resistor 36 to thus decrease the charging current of the timing capacitor. The negative going voltage on the lower terminal of the timing capacitor is, however, coupled through the cathode follower tube 10 to the base of the Miller integrator amplifier transistor 22 and is amplified and inverted by such transistor. This inverted voltage is then fed back through the timing capacitor 32 to oppose any change of voltage at the grid of cathode follower tube 10. This means that the voltage across timing resistor 36 remains substantially constant and that the charging of timing capacitor 32 remains substantially constant, as is true of the conventional Miller sweep circuits.

The ramp-shaped voltage developed across timing capacitor 32 by the operation just described appears at output terminals 40 and 42. Also the positive going ramp output voltage is applied to the hold-off capacitor 88 through coupling diode 90 to charge such hold-off capacitor, for example, to approximately +13 volts. This positive going voltage is applied to the base of transistor 68 and near +12 volts renders the emitter-collector circuit of such transistor suddenly nonconducting. The result is to reduce the current flowing through tunnel diode 64 below its valley current to revert the tunnel diode bistable multivibrator from its high voltage stable state back to its original low voltage stable state and to produce a negative going step voltage on the anode of such tunnel diode. The negative going step voltage is applied to the base of switching transistor 74 to render such transistor again nonconducting and to produce a positive going step voltage on its collector which is transmitted through the coupling diode 82 to the anodes of disconnect diodes 48 and 50. As a result the disconnect diodes 48 and 50 are rendered conducting to discharge the timing capacitor 32 and to return the sweep output voltage to its normal quiescent value.

At the same time that the sweep output voltage returns to its quiescent value, the hold-off capacitor 88 begins to discharge the positive voltage accumulated thereon. However, the discharge path for such hold-off capacitor is not the same as its charge path as previously discussed, because of the coupling diode 90. The resulting hold-off voltage returns to its normal quiescent value at a slower rate than that of the sweep output voltage and thereby prevents retriggering of the tunnel diode 64 for a sufficient time after the return of such output voltage to its initial value to allow discharge of all of the circuit capacitance including timing capacitor 32 to their quiescent voltages so that subsequent time base sweep signals will be nearly identical.

It should be noted that the timing resistor 36, timing capacitor 32 and hold-off capacitor 88 are changed in value by switching a plurality of different resistors and capacitors into and out of the circuit by suitable ganged selector switches in order to vary the sweep speed of the horizontal sweep signal. Since the quiescent current through the timing resistor 36 and the disconnect diode 50 tends to change with the resistance value of the timing resistor, the initial or quiescent grid bias voltage of the cathode follower tube 10 also tends to vary. Any variation in such bias voltage will vary the starting voltage of the time base sweep signal. When a transistorized sweep generator circuit is used the total sweep voltage from the start to the end of the sweep may be only 10 volts so that an error of only 1 volt will amount to 10% of the total sweep voltage. Such an error can be tolerated in a conventional vacuum tube sweep generator circuit having a sweep voltage in the neighborhood of 150 volts since such an error would be less than 1%. It is the primary function of the clamping or comparator transistor 52 to substantially eliminate this bias voltage error due to changes in the timing resistor by controlling the current flow through disconnect diode 50.

Since the disconnect diodes 48 and 50 are normally conducting, a degenerative D.C. voltage feedback loop is established from the collector of the Miller amplifier transistor to the input of the cathode follower tube 10 through the feedback emitter follower transistor 26, disconnect diode 48, clamping transistor 52 and disconnect diode 50. Thus, any change in D.C. bias voltage on the grid of the cathode follower tube is inverted and fed back through such D.C. feedback circuit to oppose such change and to correct the bias voltage by controlling the current flow through diode 50. A reference voltage is applied to the base of the clamping transistor 52 and is compared with the output voltage of the Miller circuit applied to the emitter of such transistor, so that any variation of such output voltage from the reference voltage is amplified by the transistor 52 and applied as a correction voltage through the anode of the disconnect diode 50 to the grid of the tube 10. The result is that the quiescent current flow through diode 50 is controlled so that the bias voltage on the grid of the tube 10 remains substantially constant and also the quiescent output voltage of the circuit remains substantially constant.

The cathode follower tube 10 is inserted between the Miller amplifier transistor 22 and the common terminal of the timing resistor 36 and the timing capacitor 32 because such a vacuum tube draws very little grid current during class A operation when its grid is negative with respect to its cathode, as opposed to a rather large base current drawn by the Miller amplifier transistor 22, or even an emitted follower transistor if it were substituted for such cathode follower tube. This low grid current causes substantially the same charging current to flow in the timing capacitor as flows in the timing resistor when the disconnect diodes are reverse biased since diode 50 is chosen to have a very low leakage current. Since substantially the same current flows in the timing capacitor 32 as in the timing resistor 36 and this charging current is substantially constant regardless of the voltage across such timing capacitor due to the action of the Miller integrator circuit, the ramp-shaped voltage produced by the charging of such timing capacitor is extremely linear. This is true even when vacuum tubes having different operating characteristics due to aging, etc. are employed for the cathode follower tube 10.

It will be obvious to those having ordinary skill in the art that many changes may be made in the details of the above-described preferred embodiment of the present invention. For example, the tunnel diode 64 may be replaced by a pair of suitably connected transistors or vacuum tubes form a bistable multivibrator and the Miller integrator circuit may be connected as a "run-down," rather than a "run-up" type sweep circuit by obvious changes including the substitution of PNP-type for NPN transistors and vice versa. Therefore, it is not intended to limit the scope of the present invention to the above-described preferred embodiment thereof but that scope should only be determined by the following claims.

We claim:

1. A ramp voltage generator circuit, comprising:
a timing capacitor;
a plurality of timing resistors having different values of resistance;
switch means for selectively connecting said timing resistors in series with said timing capacitor and a source of current;
means for regulating the flow of current through the selected timing resistor to produce a ramp voltage across said capacitor which varies linearly from a starting voltage;
gate means which is nonconducting during the production of said ramp voltage, and which is rendered conducting to return said ramp voltage to said starting voltage and to conduct current flowing through said selected resistor so that said starting voltage tends to vary with the resistance values of said resistors;
and comparator means responsive to a difference in voltage between said starting voltage and a reference voltage for maintaining said starting voltage substantially constant when different timing resistors are selected by said switch means.

2. An electrical signal generator circuit, comprising:
signal forming means including a plurality of different timing capacitors, a plurality of different timing resistors connected to said timing capacitors by a selector switch, and a source of charging current connected to certain of said timing capacitors and resistors depending upon the setting of said switch;
amplifier means connected to said signal-forming means for regulating the flow of said charging current through the selected timing capacitor by degenerative A.C. voltage feed-back so that this charging current remains substantially constant and an output voltage signal having ramp portion of linearly increasing magnitude is generated in said signal-forming means;
gate means connected to said signal-forming means and said amplifier means for controlling the time when said charging current flows through said timing capacitor, said gate means providing a degenerative D.C. voltage feedback path for said amplifier means when said charging current is not flowing through said timing capacitor for maintaining the starting voltage of said ramp signal portion substantially constant regardless of a change in the value of the timing resistor connected to said current source;

switch means connected to said gate means to change the current conduction of said gate means between conducting and nonconducting conditions in response to an input trigger pulse so that said charging current flows through said charging capacitor during one of said conditions.

3. A ramp signal generator circuit, comprising:

a signal-forming network including a plurality of different timing capacitors, a plurality of different timing resistors connected to said timing capacitors by a selector switch, and a source of charging current connected to certain of said timing capacitors and resistors depending upon the setting of said switch;

amplifier means connected to said signal-forming network with its input connected across the selected timing resistor and its output connected to its input through the selected timing capacitor for regulating the flow of said charging current through said timing capacitor by degenerative A.C. voltage feedback from the output to the input of said amplifier means so that said charging current remains substantially constant and an output voltage signal having ramp portion of linearly increasing magnitude is generated in said network;

gate means connected to said signal-forming network and said amplifier means including a pair of disconnect diodes for controlling the time when said charging current flows through said timing capacitor, and a clamping transistor providing a degenerative D.C. voltage feedback path for said amplifier means when said diodes are forward biased and said charging current is not flowing through said timing capacitor for maintaining the starting voltage of said ramp signal portion substantially constant regardless of a change in the value of the timing resistor connected to said current source; and switch means including a gating multivibrator connected to said gate means to change the current conduction of said gate means from a conducting to a nonconducting condition by reverse biasing said disconnect diodes in response to an input trigger pulse so that said charging current flows through said charging capacitor rather than said diodes during said nonconducting condition.

4. A time base sweep signal generator circuit, comprising:

a signal-forming network including a plurality of different timing capacitors, a plurality of different timing resistors connected to said timing capacitors by a selector switch, and a source of charging current connected to certain of said timing capacitors and resistors depending upon the setting of said switch;

feedback amplifier means connected to said signal-forming network for regulating the flow of said charging current through the selected timing capacitor by degenerative A.C. voltage feedback so that said charging current remains substantially constant and an output voltage sweep signal having ramp portion of linearly increasing magnitude and a retrace portion of decreasing magnitude is generated in said network;

gate means connected to said signal-forming network and said amplifier means for controlling the time when said charging current flows through said timing capacitor, said gate means providing a degenerative D.C. voltage feedback path for said amplifier means when said charging current is not flowing through said timing capacitor for maintaining the starting voltage of said ramp signal portion substantially constant regardless of a change in the value of the timing resistor connected to said current source;

switch means including a bistable gating multivibrator connected to said gate means between conducting and nonconducting conditions by switching said multivibrator to one of its stable states in response to an input trigger pulse so that said charging current flows through said charging capacitor during only one of said conditions; and hold-off means connected from the output of said signal-forming network to the input of said gating multivibrator for generating a hold-off signal whose leading edge corresponds to that of said ramp signal portion and switching said multivibrator to revert it to the other of its stable states in response to the leading edge portion of said hold-off signal and for preventing the retriggering of said multivibrator by subsequent trigger pulses for a limited time with the trailing edge portion of said hold-off signal by increasing the fall time of said trailing portion.

5. A ramp signal generator circuit, comprising:

a Miller integrator circuit including a vacuum tube connected as a cathode follower amplifier, a transistor connected as a common emitter amplifier with its input connected to the output of said tube and its output connected to the input of said tube through a feedback circuit including a timing capacitor, and a timing resistor connected from a source of charging current to said timing capacitor and the input of said tube;

a gate circuit including a pair of normally forward biased first and second disconnect diodes with each one of said diodes connected at one terminal to a different plate of said timing capacitor, a comparator transistor connected between said diodes to their other terminals; and a switching circuit including a multivibrator connected at its output to the other terminal of the first disconnect diode which has its one terminal connected to said timing resistor so that said charging current normally flows through said first diode rather than said timing capacitor and a trigger pulse applied to to the input of said multivibrator will cause it to switch from a first to a second stable state, thereby transmitting a voltage pulse for reverse biasing said diodes which enables said charging current to flow through said timing capacitor in order to generate a ramp-shaped voltage signal which starts at a substantially constant voltage set by a reference voltage on said comparator transistor and increases in magnitude substantially linearly.

6. A ramp signal generator circuit, comprising:

a Miller integrator circuit including a vacuum tube connected as a cathode follower amplifier, a transistor connected as a common emitter amplifier with its input connected to the output of said tube and its output connected to the input of said tube through a feedback circuit including a timing capacitor, and a timing resistor connected from a source of charging current to said timing capacitor and the grid of said tube;

a gating circuit including a pair of normally forward biased first and second disconnect diodes each connected at one terminal to a different plate of said timing capacitor, a comparator transistor connected between said diodes at its emitter and collector to their other terminals, and connected at its base to a reference voltage, and a bistable multivibrator connected at its output to the other terminal of the first disconnect diode which has its one terminal connected to said timing resistor so that said charging current normally flows through said first diode rather than said timing capacitor and a trigger pulse applied to the input of said multivibrator will cause it to switch from a first to a second stable state, thereby transmitting a voltage pulse for reverse biasing said diodes which enables said charging current to flow through said timing capacitor in order to generate a ramp-shaped voltage signal which starts at a substantially constant voltage set by said reference voltage and increases magnitude substantially linearly; and a hold-off circuit means connected from the output of said Miller integrator circuit to the input of said gating circuit in order to transmit a portion of said ramp signal as a hold-off signal to the input of said bistable multivibrator after increasing the fall time of the return of the trailing edge of said hold-off signal for reverting said multivibrator back to said first state from said second state and for preventing the triggering of said multivibrator by subsequent trigger pulses during said return of said trailing edge.

7. A time base sweep signal generator circuit for a cathode ray oscilloscope, comprising:

a Miller integrator circuit including a vacuum tube connected as a cathode follower amplifier, a transistor connected as a common emitter amplifier with its base connected to the cathode of said tube and its collector connected to the grid of said tube through a feedback circuit including a plurality of different timing capacitors, a plurality of different timing resistors connected with said timing capacitors into said integrator circuit by a selector switch, and a source of charging current connected to the selected timing resistor;

a gating circuit including a pair of normally forward biased first and second disconnect diodes each connected at one terminal to a different plate of the selected timing capacitor, a clamping transistor connected by its emitter and collector to a different one of the other terminals of said diodes, and a bistable multivibrator connected at its output to the other terminal of the first disconnect diode which has its one terminal connected to said timing resistor so that said charging current normally flows through said first diode rather than said timing capacitor and a trigger pulse applied to the input of said multivibrator will cause it to switch from a first to a second stable state, thereby transmitting a voltage pulse for reverse biasing said diodes which enables said charging current to flow through said timing capacitor in order to generate a ramp-shaped voltage signal set by said clamping transistor which starts at a substantially constant voltage and increases in magnitude substantially linearly regardless of the value of the selected timing capacitor and timing resistor; and a hold-off circuit means including a hold-off capacitor connected to the base of a control transistor whose collector is connected to said multivibrator and whose emitter is connected to at least two sources of biasing current for said multivibrator through a pair of voltage limiting diodes which set the upper and lower voltage limits of said emitter, said hold-off means being connected from the output of said Miller integrator circuit to the input of said gating circuit in order to transmit a portion of said ramp signal as a hold-off signal to the input of said bistable multivibrator after increasing the fall time of the return of the trailing edge of said hold-off signal for reverting said multivibrator back to said first state from said second state and for preventing the triggering of said multivibrator by subsequent trigger pulses during said return of said trailing edge.

8. A time base sweep signal generator circuit for a cathode ray oscilloscope, comprising:

a Miller integrator circuit including a vacuum tube connected as a cathode follower amplifier, a transistor connected as a common emitter amplifier with its input connected to the output of said tube and its output connected to the input of said tube through a feedback circuit including transistor connected as an emitter follower amplifier, a timing capacitor, a timing resistor connected at one terminal in series with said timing capacitor and a source of charging current connected to the other terminal of said timing resistor;

a gating circuit including a pair of normally forward biased first and second disconnect diodes each connected at one terminal to a different plate of said timing capacitor, a clamping transistor connected between said diodes to their other terminals, and a tunnel diode connected as a bistable multivibrator connected at its output to the other terminal of the first disconnect diode which has its one terminal connected to said timing resistor so that said charging current normally flows through said first diode rather than said timing capacitor and a trigger pulse applied to the input of said multivibrator will cause it to switch from a first to a second stable state, thereby transmitting a voltage pulse for reverse biasing said diodes which enables said charging current to flow through said timing capacitor in order to generate a ramp-shaped voltage signal which starts at a substantially constant voltage set by said clamping transistor and increases in magnitude substantially linearly; and a hold-off circuit including a hold-off capacitor connected to the output of said emitter follower transistor through a coupling diode to allow the output sweep signal to be obtained from the output of said emitter follower transistor by preventing the discharge of said hold-off capacitor through said coupling diode, said hold-off circuit being connected from the output of said Miller integrator circuit to the input of said gating circuit in order to transmit a portion of said ramp signal as a hold-off signal to the input of said bistable multivibrator after increasing the fall time of the return of the trailing edge of said hold-off signal by said hold-off capacitor for reverting said multivibrator back to said first state from said second state and for preventing the triggering of said multivibrator by subsequent trigger pulses during said return of said trailing edge.

References Cited in the file of this patent

UNITED STATES PATENTS

| | | |
|---|---|---|
| 2,853,609 | Ropiequet et al. | Sept. 23, 1958 |
| 2,864,949 | Gleason | Dec. 16, 1958 |